(12) United States Patent
Kato et al.

(10) Patent No.: US 11,664,201 B2
(45) Date of Patent: May 30, 2023

(54) SUBSTRATE HOLDING MECHANISM AND SUBSTRATE PROCESSING APPARATUS

(71) Applicant: Tokyo Electron Limited, Tokyo (JP)

(72) Inventors: Hitoshi Kato, Iwate (JP); Toshiyuki Nakatsubo, Iwate (JP); Takeshi Kobayashi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 227 days.

(21) Appl. No.: 17/148,963

(22) Filed: Jan. 14, 2021

(65) Prior Publication Data
US 2021/0249235 A1    Aug. 12, 2021

(30) Foreign Application Priority Data

Feb. 7, 2020   (JP) .............................. JP2020-020124

(51) Int. Cl.
| | | |
|---|---|---|
| H01J 37/32 | (2006.01) | |
| C23C 16/455 | (2006.01) | |
| C23C 16/458 | (2006.01) | |
| H01L 21/687 | (2006.01) | |

(52) U.S. Cl.
CPC .... *H01J 37/32715* (2013.01); *C23C 16/4584* (2013.01); *C23C 16/4588* (2013.01); *C23C 16/45536* (2013.01); *C23C 16/45544* (2013.01); *H01L 21/68728* (2013.01); *H01J 2237/20214* (2013.01); *H01J 2237/332* (2013.01)

(58) Field of Classification Search
CPC ....... H01J 37/32715; H01J 2237/20214; H01J 2237/332; C23C 16/45536; C23C 16/45544; C23C 16/4588; C23C 16/45551; C23C 16/4584; C23C 16/4585; C23C 16/4586; C23C 16/507; H01L 21/67103; H01L 21/68728; H01L 21/68742; H01L 21/68764; H01L 21/68771
See application file for complete search history.

(56) References Cited

U.S. PATENT DOCUMENTS

| | | | | |
|---|---|---|---|---|
| 5,775,000 | A | * 7/1998 | Maekawa | ......... H01L 21/68728 134/902 |
| 2003/0098048 | A1 | * 5/2003 | Kuroda | ..................... B08B 3/04 134/32 |

(Continued)

FOREIGN PATENT DOCUMENTS

JP    2016-096220    5/2016

*Primary Examiner* — Ram N Kackar
*Assistant Examiner* — Laureen Chan
(74) *Attorney, Agent, or Firm* — IPUSA, PLLC

(57) ABSTRACT

A substrate holding mechanism for holding a substrate placed on a stage which is rotatable with respect to a turntable, includes a substrate holding member, provided at a peripheral portion of the stage, fixed to a rotating shaft disposed below a surface on which the substrate is placed, and contactable to a side surface of the substrate placed on the stage, a biasing member having a first end fixed to the substrate holding member at a position closer to a center of the stage than the rotating shaft, and a second end fixed at a position separated from the substrate holding member toward the center of the stage and below the rotating shaft, and a pressing member configured to press upwardly a portion of the substrate holding member where the first end of the biasing member is fixed.

20 Claims, 10 Drawing Sheets

(56) References Cited

U.S. PATENT DOCUMENTS

2005/0076531 A1* 4/2005 Smith ............... H01L 21/68728
                                                    34/313
2016/0122872 A1* 5/2016 Kato ................. H01L 21/68764
                                                    118/712
2016/0240425 A1* 8/2016 Kato ................. H01L 21/68764

* cited by examiner

SUBSTRATE HOLDING MECHANISM AND SUBSTRATE PROCESSING APPARATUS

CROSS-REFERENCE TO RELATED APPLICATIONS

This application is based upon and claims priority to Japanese Patent Application No. 2020-020124, filed on Feb. 7, 2020, the entire contents of which are incorporated herein by reference.

BACKGROUND

1. Field of the Invention

The present disclosure relates to substrate holding mechanism and substrate processing apparatuses.

2. Description of the Related Art

A known apparatus forms various films on a substrate by rotating a turntable having a plurality of substrates placed thereon so that each substrate revolves, and repeatedly passing each substrate through a process gas supply region disposed in a radial direction of the turntable (refer to Japanese Laid-Open Patent Publication No. 2016-96220, for example). In this apparatus, a stage on which the substrate is placed, is rotated so that the substrate rotates while the substrate is caused to revolve by the turntable, so that the film becomes uniform in a circumferential direction of the substrate.

SUMMARY

According to one aspect of the embodiments, a substrate holding mechanism for holding a substrate placed on a stage which is rotatable with respect to a turntable, includes a substrate holding member, provided at a peripheral portion of the stage, fixed to a rotating shaft disposed below a surface on which the substrate is placed, and contactable to a side surface of the substrate placed on the stage; a biasing member having a first end fixed to the substrate holding member at a position closer to a center of the stage than the rotating shaft, and a second end fixed at a position separated from the substrate holding member toward the center of the stage and below the rotating shaft; and a pressing member configured to press upwardly a portion of the substrate holding member where the first end of the biasing member is fixed.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1:
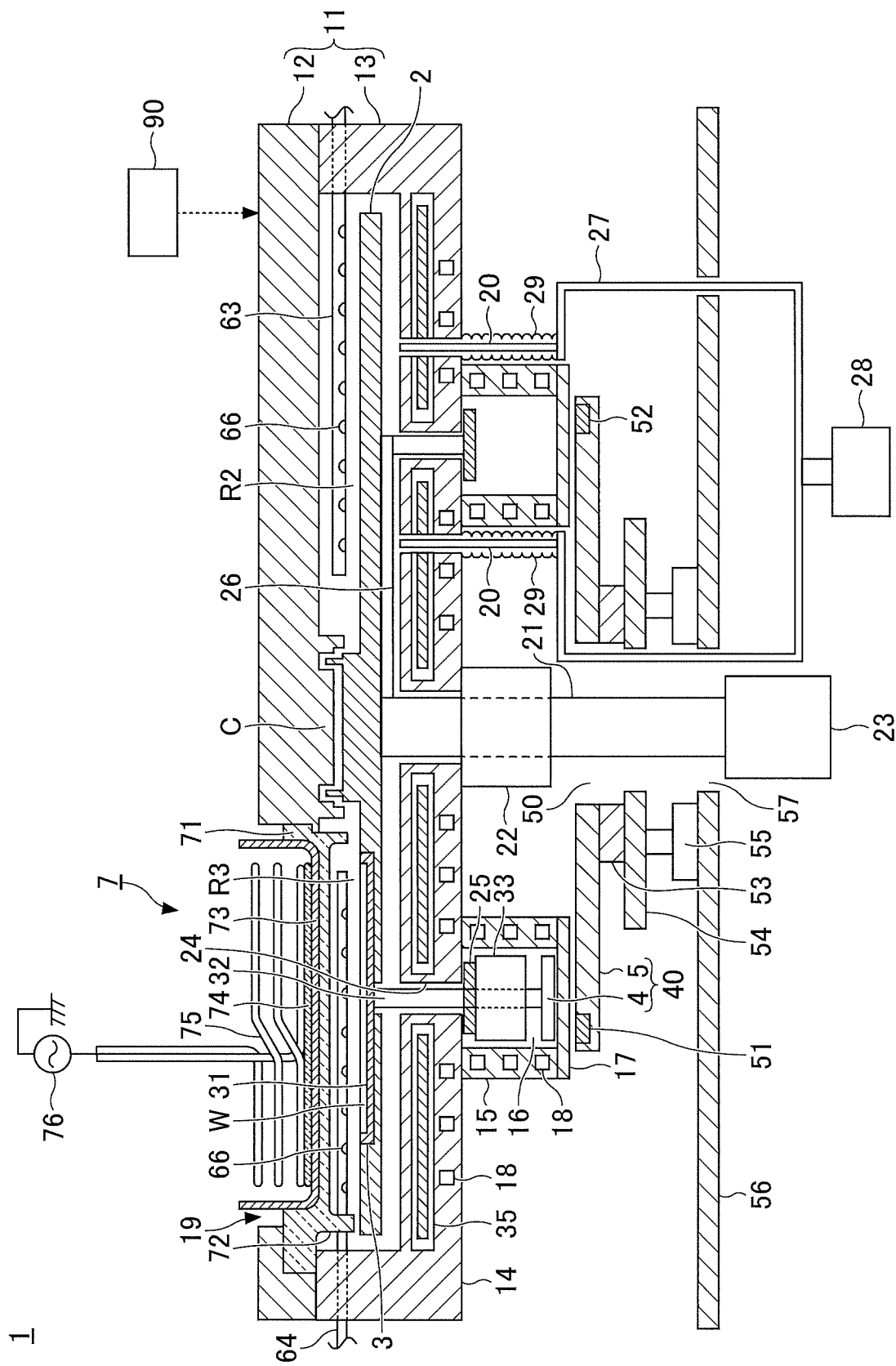
FIG. 1 is a longitudinal cross sectional view illustrating an example of a film forming apparatus in one embodiment.

A description will hereinafter be given of non-limiting embodiments of the present disclosure, with reference to the accompanying drawings. In all of the accompanying drawings, the same or corresponding parts or components will be designated by the same or corresponding reference numerals, and a repeated description of the same or corresponding parts or components will be omitted.

The present disclosure provides a technique for reducing rotation of a substrate with respect to a stage when the substrate placed on the stage is caused to revolve.

[Substrate Processing Apparatus]

Figure 2:
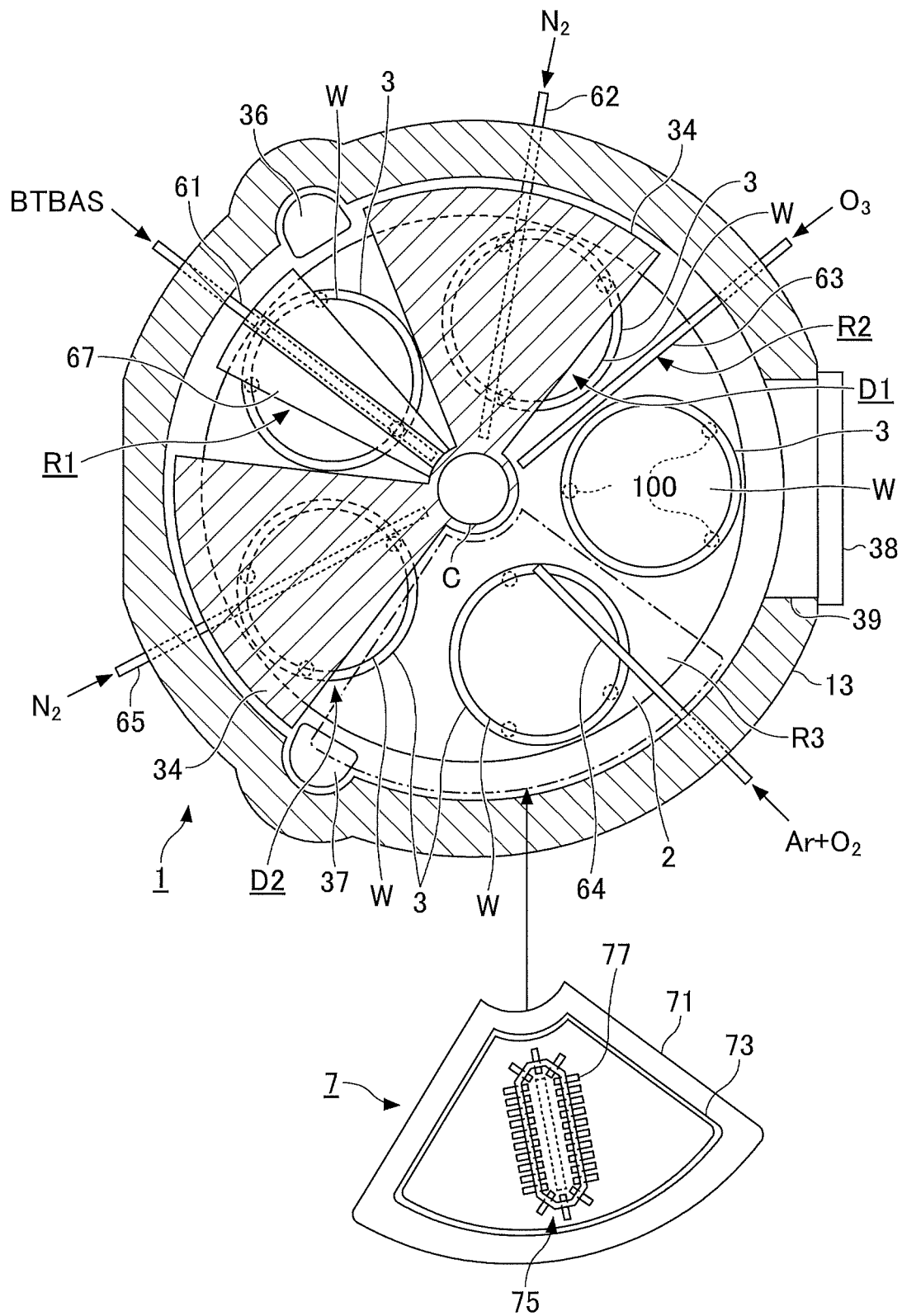
FIG. 2 is a transverse cross sectional view illustrating the example of the film forming apparatus in the embodiment.
Figure 3:
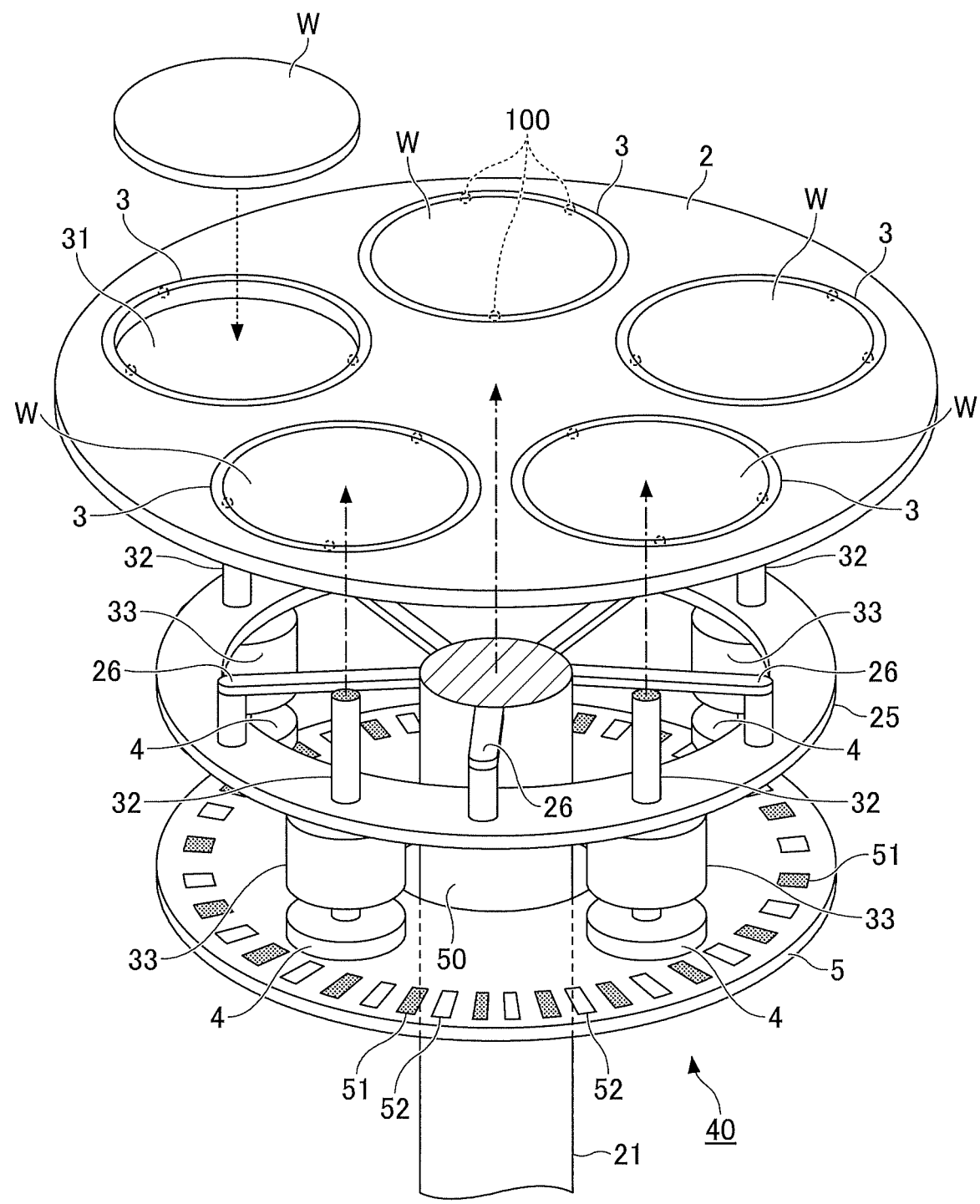
FIG. 3 is a schematic perspective view of a turntable provided in the film forming apparatus in the embodiment.

A substrate processing apparatus according to one embodiment will be described with reference to FIG. 1 through FIG. 5 illustrating an example of a film forming apparatus (or film deposition apparatus) which forms a film by Atomic Layer Deposition (ALD) on a semiconductor wafer (hereinafter simply referred to as a "wafer") W. The wafer W is an example of a substrate. FIG. 1 is a longitudinal cross sectional view illustrating the example of the film forming apparatus in this embodiment. FIG. 2 is a transverse cross sectional view illustrating the example of the film forming apparatus in this embodiment. FIG. 3 is a schematic perspective view of a turntable provided in the film forming apparatus in this embodiment.

A film forming apparatus 1 is configured to form a silicon oxide ($SiO_2$) film by ALD on the wafer W which is placed on a turntable 2 to rotate and revolve, by sequentially and repeatedly supplying a silicon source gas and an oxidizing gas to the wafer W, to cause mutual reaction between the silicon source gas and the oxidizing gas.

The film forming apparatus 1 includes a vacuum chamber 11 which is a flat processing chamber having a planar shape which is generally circular in a plan view. The vacuum chamber 11 includes a top plate 12, and a chamber body 13 forming a sidewall and a bottom portion 14 of the vacuum chamber 11. A turntable 2 is provided inside the vacuum chamber 11. The turntable 2 is formed to have a horizontal disk shape. A rotating shaft 21, extending vertically downward, is connected to a center portion of the turntable 2. The rotating shaft 21 penetrates a bearing section 22 which is provided in the bottom portion 14 forming the chamber body 13, and is connected to a rotating mechanism 23 provided outside the vacuum chamber 11. The rotating mechanism 23 causes the turntable 2 to revolve. The rotating mechanism 23 rotates the turntable 2 clockwise, for example, when viewed from a top surface side of the turntable 2.

The bottom portion 14 of the chamber body 13 is provided with a slit 24, which penetrates the bottom portion 14 along a thickness direction of the bottom portion 14, and has a planar shape which is annular in the plan view so as to surround the rotating shaft 21. A space forming section 15, which has an annular shape in the plan view and a concave shape in the longitudinal cross sectional view, is provided below the bottom portion 14. A space inside the concave portion is partitioned from the outside of the vacuum chamber 11, and is evacuated into a vacuum atmosphere by exhaust ports 36 and 37 which will be described later, during a film forming process. If the space inside the concave portion a driven gear moving space 16, the driven gear moving space 16 is provided with a horizontal supporting toroidal plate 25 near the bottom portion 14 of the chamber body 13. In addition, a bottom portion of the space forming section 15 is formed of a horizontal toroidal plate, and this horizontal toroidal plate is regarded as a partitioning plate 17. The partitioning plate 17 is an example of a partitioning member, and is formed of a material which passes magnetic field lines formed between a driven gear 4 and a driving gear 5 which will be described later, such as aluminum (Al), stainless steel (SUS), or the like. A coolant flow passage 18 is provided in a sidewall of the space forming section 15, and the bottom portion 14.

Next, structures of the turntable 2 and each component associated with the turntable 2 will be described, with reference to FIG. 3 which is a schematic perspective view of these structures. Five spokes 26 extend radially in the plan view from an upper end portion of the bearing section 22 described above, and the turntable 2 is supported on the spokes 26. The spokes 26 are formed of an alloy such as Inconel (registered trademark) or the like, for example, so as to have a high strength and a high heat resistance. A tip end of each spoke 26 curves downward along the slit 24 of the chamber body 13, and connects to an upper surface of the supporting toroidal plate 25. Accordingly, the supporting toroidal plate 25 is supported on the rotating shaft 21 by the spokes 26.

Stages 3, which have a circular shape in the plan view and revolve due to the rotation of the turntable 2, are provided on an upper surface side of the turntable 2. In this example, five stages 3 are provided along a rotating direction (or circumferential direction) of the turntable 2. A recess 31 is formed in an upper surface of the stage 3, to accommodate the wafer W which is placed in a horizontal position on the stage 3. An inner diameter of the recess 31 is set slightly larger than a diameter of the wafer W, for example. If the diameter of the wafer W is 300 mm, for example, the inner diameter of the recess 31 may be 301 mm to 303 mm. A substrate holding mechanism 100 for holding the wafer W which is placed in the recess 31 of the stage 3, is provided in a peripheral portion of the stage 3. The substrate holding mechanism 100 fixes and holds the wafer W so that the wafer W does not escape from the recess 31, and the wafer W does not rotate with respect to the stage 3, even when the turntable 2 and the stage 3 rotate. FIG. 2 and FIG. 3 illustrate an example in which three substrate holding mechanisms 100 are provided on each stage 3. Details of the substrate holding mechanism 100 will be described later.

A rotating shaft 32, corresponding to an axis of rotation and supporting the stage 3, is provided at a center portion on a lower surface side of each stage 3, and extends vertically downward. Each rotating shaft 32 penetrates the supporting toroidal plate 25, and also penetrates each of five bearing units 33 (only four bearing units 33 are illustrated in FIG. 3) which are supported and provided on a lower surface of the supporting toroidal plate 25. A position where the rotating shaft 32 penetrates the supporting toroidal plate 25 is located between two adjacent spokes 26 when the supporting toroidal plate 25 is viewed in the circumferential direction thereof. In other words, the rotating shafts 32 and the spokes 26 are alternately disposed on the supporting toroidal plate 25. The bearing unit 33 includes a bearing (not illustrated) which surrounds the rotating shaft 32 so that the rotating shaft 32 is freely rotatable, and a magnetic seal (not illustrated) which prevents particles scattering from the bearing. According to this structure, the rotating shafts 32 are rotatably provided at portions which rotate together with the turntable 2. In addition, the rotating shafts 32 are supported by the bearing units 33, and the bearing units 33 are supported with respect to the rotating shaft 21, via the supporting toroidal plate 25 and the spokes 26.

The driven gear 4 having a horizontal disk shape is provided on a lower end portion of the rotating shaft 32, coaxially with the rotating shaft 32, so that a center axis of the driven gear 4 coincides with a center axis of the rotating shaft 32. Accordingly, the driven gear 4 is connected to the stage 3 via the rotating shaft 32, and the driven gear 4 rotates around the rotating shaft 21 of the turntable 2 in a horizontal direction according to the rotation of the turntable 2. Further, when the driven gear 4 is rotated in the circumferential direction, each stage 3 rotates around the rotating shaft 32.

Figure 4:
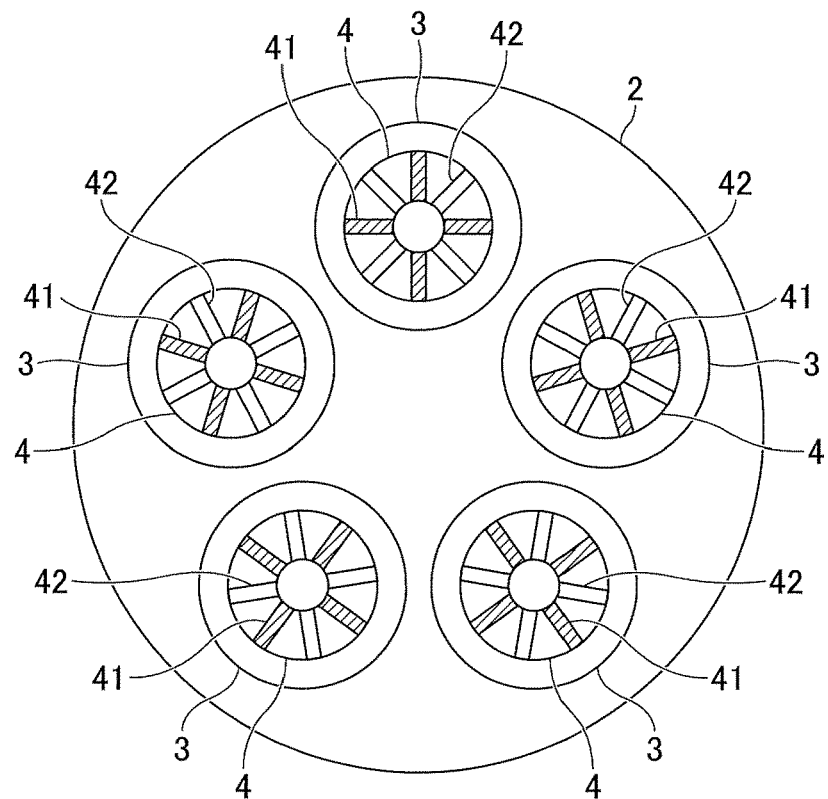
FIG. 4 is a diagram schematically illustrating a driven gear provided on a lower surface of a stage.

FIG. 4 schematically illustrates the lower surface side of the driven gear 4. A large number of permanent magnets are embedded in the lower surface side of the driven gear 4, around the entire circumference along the rotating direction of the driven gear 4. The permanent magnets embedded around the entire circumference means that a region where the permanent magnet is provided does not exist locally when viewed in the rotating direction of the driven gear 4. Accordingly, even if a gap is formed between the permanent magnets which are adjacent to each other along the rotating direction, the permanent magnets are provided around the entire circumference, and in this example, such a gap is provided between the adjacent permanent magnets.

When magnetic poles of the permanent magnets provided on the driven gear 4 are referred to as north pole portions (hereinafter referred to as "N-pole portions") 41 and south pole portions (hereinafter referred to as "S-pole portions") 42, the N-pole portions 41 and the S-pole portions 42 are alternately disposed along a rotation direction (rotating direction) when the driven gear 4 is viewed from the lower surface side thereof. In order to distinguish the N-pole portions 41 from the S-pole portions 42, the N-pole portions 41 are indicated by hatchings in FIG. 4. In this example, the N-pole portions 41 and the S-pole portions 42, which are exposed at a lower surface of the driven gear 4, are formed in the same strip shape and disposed radially in a lateral direction from the center portion of the lower surface of the driven gear 4. The N-pole portions 41 and the S-pole portions 42 are spaced apart from each other in the circumferential direction, and a total of eight pole portions 41 and 42 are disposed on the driven gear 4, for example. Lengths of the N-pole portions 41 and the S-pole portions 42 are set to be shorter than the radius of the driven gear 4, so as not to exceed the center of a bottom surface of the driven gear 4, for example. In order to reduce demagnetization under a high-temperature environment, the permanent magnets forming the driven gear 4 and the permanent magnets forming the driving gear 5 are formed of samarium cobalt magnets, for example.

As illustrated in FIG. 1 and FIG. 3, the driving gear 5 is disposed outside (on atmosphere side of) the vacuum chamber 11, below the space forming section 15. The driving gear 5 and the driven gear 4 form a magnetic gear mechanism 40.

The driving gear 5 is a horizontal annular plate formed along the entire circumference of a revolving orbit of the driven gear 4, and is provided to face the revolving orbit. Hence, an upper surface of the driving gear 5 faces the lower surface of the driven gear 4.

A circular opening 50 is formed in the center portion of the driving gear 5. The center of the opening 50 coincides with a center of rotation of the turntable 2 in the plan view. In addition, as illustrated in FIG. 1, a rotating mechanism 53 for rotation, including an annular direct drive motor (DD motor) for rotating the driving gear 5, for example, is provided on the lower surface of the driving gear 5 so as to surround the rotating shaft 21. The rotating mechanism 53 rotates the driving gear 5 around the center of the opening 50 as a center of rotation of the driving gear 5. Accordingly, the driving gear 5 rotates in a state facing the revolving orbit of the driven gear 4. The rotating mechanism 53 is provided on an elevating platform 54 which has a toroidal shape in the plan view and surrounds the rotating shaft 21, and the elevating platform 54 is raised and lowered by a driving gear elevating mechanism 55. The driving gear elevating mechanism 55 is provided on a horizontal floor plate 56. The floor plate 56 includes an opening 57 penetrated by rotating shaft 21.

The driving gear 5 will be described in more detail. Permanent magnets are embedded in the upper portion of the driving gear 5 around the entire circumference of the driving gear 5, so as to oppose an outer periphery of the revolving orbit of the driven gear 4. The permanent magnets embedded around the entire circumference means that a region where the permanent magnet is provided does not exist locally when viewed in the rotating direction of the driving gear 5, and it does not mean that the permanent magnets are provided without gaps along the rotating direction. In this example, such a gap is provided between the permanent magnets which are adjacent to each other along the rotating direction. When the magnetic poles of the permanent magnets disposed in the driving gear 5 are referred to as N-pole portions 51 and S-pole portions 52, the N-pole portions 51 and the S-pole portions 52 are alternately disposed along the rotating direction of the driving gear 5 when the driven gear 4 is viewed from the upper side thereof. Further, in FIG. 3 and FIG. 5 which will be described later, the N-pole portions 51 are also indicated by hatchings, similar to the N-pole portions 41 of the driven gear 4.

Figure 5:
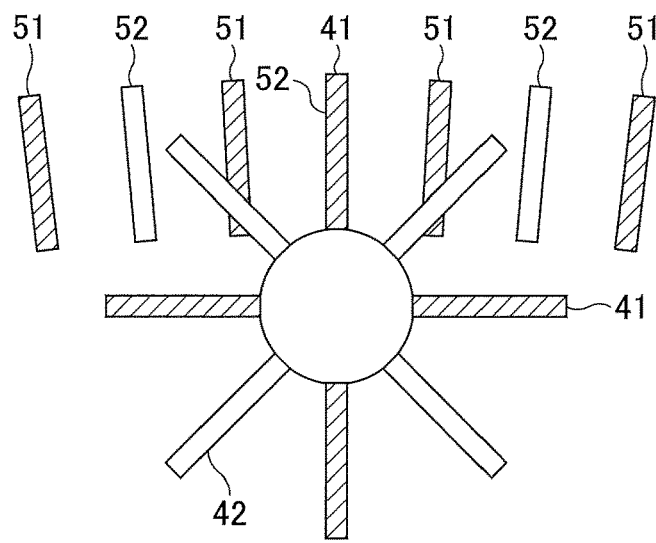
FIG. 5 is a top view illustrating a portion of the driven gear and a driving gear.

FIG. 5 is a diagram illustrating the magnetic pole portions (N-pole portions 41 and S-pole portions 42) of one driven gear 4, and magnetic pole portions (N-pole portions 51 and S-pole portions 52) of the driving gear 5 below this one driven gear 4, in correspondence with one another. For example, the N-pole portions 51 and the S-pole portions 52 are formed in the strip shape, so as to overlap the strip shape of the N-pole portions 41 and the S-pole portions 42 formed in the lower surface of the driven gear 4. FIG. 5 illustrates a state where the N-pole portions 41 of the driven gear 4 and the S-pole portions 52 of the driving gear 5 overlap each other. Further, because FIG. 5 is a schematic diagram for explaining the structure of the magnetic gear, the illustrated number of the magnetic pole portions may differ from the actual number of the magnetic pole portions of the apparatus.

The driven gear 4 stops at a position determined by the combined action of attractive forces and repulsive forces between each of the magnetic pole portions (N-pole portions 41 and S-pole portions 42) of the driven gear 4, and each of the magnetic pole portions (N-pole portions 51 and S-pole portions 52) of the driving gear 5. Accordingly, when the turntable 2 and the driving gear 5 are rotated at the same rotational frequency (or rotational speed), the driven gear 4 is stopped relative to the driving gear 5, and thus, the driven gear 4, that is, the stage 3, does not rotate and is stationary.

The stage 3 rotates when a difference is generated between the rotational frequencies of the driving gear 5 and the turntable 2, that is, when a velocity difference is generated between an angular velocity of the driving gear 5 and an angular velocity (so-called axial rotation angle speed) of the driven gear 4 due to the rotation of the turntable 2. When an angular velocity Va of the driving gear 5 is higher than an angular velocity Vb of the driven gear 4, a sequence of the N-pole portions 51 and the S-pole portions 52 of the driving gear 5 moves below a sequence of the N-pole portions 41 and the S-pole portions 42 of the driven gear 4 opposing the driving gear 5, from the left side to the right side as illustrated in FIG. 5. For this reason, the repulsive force and the attractive force from the driving gear 5, acting on the driven gear 4, move toward the right side. Hence, the sequence of the N-pole portions 41 and the S-pole portions 42 of the driven gear 4 is also pulled toward the right, and as a result, the driven gear 4 rotates clockwise in FIG. 5.

Further, when the angular velocity Va of the driving gear 5 is lower than the angular velocity Vb of the driven gear 4, the sequence of the N-pole portions 51 and the S-pole portions 52 of the driving gear 5 moves below the sequence of the N-pole portions 41 and the S-pole portions 42 of the driven gear 4 opposing the driving gear 5, from the right side toward the left side in FIG. 5. For this reason, the repulsive force and the attractive force from the driving gear 5, acting on the driven gear 4, move toward the left side. Thus, the sequence of the N-pole portions 41 and the S-pole portions 42 of the driven gear 4 is also pulled toward the left. As a result, the driven gear 4 rotates counterclockwise in FIG. 5.

The film forming apparatus 1 will be described, by returning to the description of FIG. 1 and FIG. 2. A center region forming section C, having a circular shape in the plan view, is provided at a center portion on the lower surface side of the top plate 12 of the vacuum chamber 11. A projecting section 34 has a fan shape in the plan view, spreading from the center region forming section C toward the outside of the turntable 2. In this example, two projecting sections 34 are provided at separate positions along the circumferential direction of the turntable 2. The center region forming section C and the projecting section 34 form a ceiling surface which is low compared to that of the outer region thereof. $N_2$ gas is supplied from a supply passage (not illustrated) into a gap between the center region forming section C and the center portion of the turntable 2, so as to reduce contact between a source gas and an oxidizing gas at the center portion of the turntable 2.

A heater 35 for heating the wafer W is embedded in the bottom portion 14 of the chamber body 13. The exhaust ports 36 and 37 open on the outside of the turntable 2 at the bottom portion 14, and connect to an evacuation mechanism (not illustrated) formed by a vacuum pump or the like. In addition, a wafer input and output section 39, which can freely be opening and closed by a gate valve 38, is formed on the side wall surface of the vacuum chamber 11. A transport mechanism (not illustrated) transports the wafer W into and out of the vacuum chamber 11, via the wafer input and output section 39.

Three raising and lowering pins 20 are provided at the bottom portion 14 of the vacuum chamber 11 near the wafer input and output section 39, to exchange the wafer W between the transport mechanism for the wafer W and the stage 3. However, for the sake of convenience, only two raising and lowering pins 20 are illustrated in FIG. 1. Although not illustrated in FIG. 1, through holes are formed at a bottom portion of the stage 3, so that the raising and lowering pins 20 penetrate the stage 3 to enable the exchange of the wafer W. Lower ends of the raising and lowering pins 20 are formed, so as not to interfere with the raising, lowering, and rotating of the driving gear 5, for example, and are supported on an arm 27 which can be freely raised and lowered by a raising and lowering mechanism 28. A bellows 29, which surrounds the raising and lowering pin 20, is provided in a periphery of the raising and lowering pin 20, and serves to maintain airtightness inside the vacuum chamber 11.

A source gas nozzle 61, a separation gas nozzle 62, an oxidizing gas nozzle 63, a reforming gas nozzle 64, and a separation gas nozzle 65 are disposed above the turntable 2 in this order, spaced apart from each other along the rotating direction of the turntable 2. Each of the gas nozzles 61 through 65 has a rod shape extending horizontally in the radial direction of the turntable 2 from the sidewall toward the center portion of the vacuum chamber 11, and discharges various gases downward from a large number of discharge holes 66 which are spaced apart from each other along a length direction of the rod shape.

The source gas nozzle 61 discharges a bis(tertiary-butylamino)silane (BTBAS) gas as the source gas. The source gas nozzle 61 is provided with a nozzle cover 67. The nozzle cover 67 covers the source gas nozzle 61, and serves to increase the concentration of the BTBAS gas below the source gas nozzle 61. The oxidizing gas nozzle 63 discharges an ozone ($O_3$) gas as the oxidizing gas. The separation gas nozzles 62 and 65 discharge a nitrogen ($N_2$) gas, and are disposed at positions respectively dividing the projecting sections 34 of the top plate 12 along the circumferential direction when viewed from the upper surface side of the top plate 12. The reforming gas nozzle 64 discharges a reforming gas which is a mixture of argon (Ar) gas and oxygen ($O_2$) gas, for example. In this example, the source gas, the oxidizing gas, and the reforming gas correspond to process gases, respectively, and the source gas nozzle 61, the oxidizing gas nozzle 63, and the reforming gas nozzle 64 correspond to process gas supplies, respectively.

A plasma forming section 7 is provided above the reforming gas nozzle 64, so as to cover the opening 19 provided in the top plate 12 of the vacuum chamber 11. In FIG. 2, the position where the plasma forming section 7 is provided is illustrated by a one-dot chain line.

The plasma forming section 7 includes a main body 71, a projecting portion 72, a Faraday shield 73, a plate member 74, an antenna 75, a high-frequency power supply 76, and slits 77. The main body 71 is formed of a dielectric, such as quartz or the like. The projecting portion 72 projects downward along the opening 19 in a lower surface of main body 71. The reforming gas is discharged from the reforming gas nozzle 64 into a region surrounded by the projecting portion 72. The antenna 75, having a metal wire wound in a coil shape, is provided on an upper surface of the main body 71 via the Faraday shield 73 and the plate member 74 which serves as an insulator. The high-frequency power supply 76 is connected to the antenna 75. The slits 77 are provided in the Faraday shield 73, and serve to direct magnetic field components of an electromagnetic field downward.

On the turntable 2, a region below the source gas nozzle 61 is an adsorption region R1 where the BTBAS gas is adsorbed, and a region below the oxidizing gas nozzle 63 is an oxidizing region R2 where the BTBAS gas is oxidized. In addition, a region below the plasma forming section 7 is a reforming region R3 where a $SiO_2$ film is reformed by the plasma. Regions below the projecting sections 34 are separating regions D1 and D2 for separating the atmosphere of the adsorption region R1 and the atmosphere of the oxidizing region R2 from each other by the $N_2$ gas discharged from the separation gas nozzles 62 and 65, respectively.

The exhaust port 36 described above opens to the outside, between the adsorption region R1 and the separating region D1 adjacent on a downstream side of the adsorption region R1 along the rotating direction, to evacuate the excess BTBAS gas. In addition, the exhaust port 37 opens to the outside near a boundary, between the reforming region R3 and the separating region D2 adjacent on downstream side of the reforming region R3 along the rotating direction, to evacuate the excess $O_3$ gas and the reforming gas. The $N_2$ gas supplied from each of the separating regions D1 and D2 and the center region forming section C is also evacuated via the exhaust ports 36 and 37.

A controller 90 is provided in the film forming apparatus 1. The controller 90 controls each part of the film forming apparatus 1. The controller 90 may be a computer or the like, for example. In addition, a computer program for operating each part of the film forming apparatus 1 may be stored in a non-transitory compute-readable storage medium. The storage medium may be a flexible disk, a compact disk, a hard disk, a flash memory, a Digital Versatile Disk (DVD), or the like, for example. For example, the controller 90 may include a processor, such as a Central Processing Unit (CPU), and may also include the storage medium. The processor may execute the program stored in the storage medium, and control each part of the film forming apparatus 1 to perform a desired operation, that is, a desired film forming process.

[Substrate Holding Mechanism]

Figure 6:
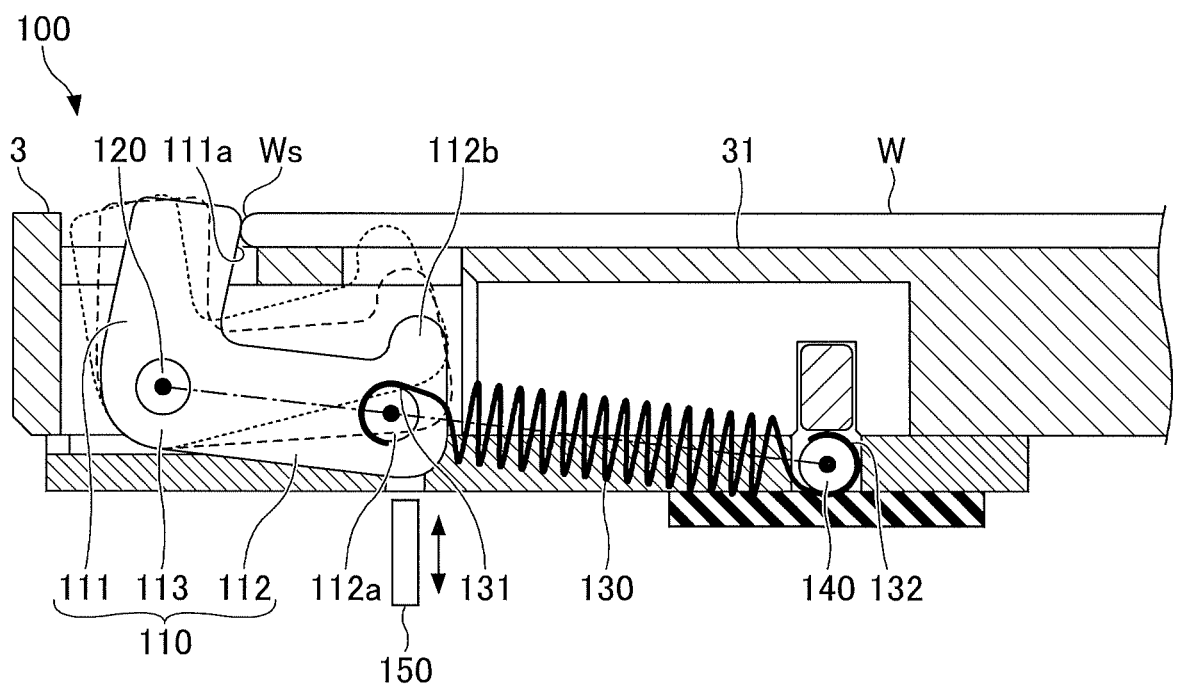
FIG. 6 is a cross sectional view illustrating an example of a substrate holding mechanism.

An example of the substrate holding mechanism 100 used in the film forming apparatus 1 will be described, by referring to FIG. 6. FIG. 6 is a cross sectional view illustrating the example of the substrate holding mechanism 100, and illustrates one of the three substrate holding mechanisms 100 provided at the peripheral portion of the stage 3. The remaining two substrate holding mechanisms 100 may have the same structure as the one substrate holding mechanism 100.

The substrate holding mechanism 100 is a mechanism for holding the wafer W on the recess 31 of the stage 3. The substrate holding mechanism 100 is provided near the outer periphery of the recess 31 of the stage 3. The recess 31 has a shape which caves in from the upper surface of the stage 3.

The number of substrate holding mechanisms 100 is not particularly limited. However, a plurality of substrate holding mechanisms 100 are preferably provided with respect to each of the stages 3, and from a viewpoint of preventing the wafer W from floating, at least three substrate holding mechanisms 100 are preferably provided with respect to each of the stages, as illustrated in FIG. 2 and FIG. 3.

The substrate holding mechanism 100 includes a substrate holding member 110, a rotating shaft 120, a spring 130, a spring support 140, and a pressing member 150.

The substrate holding member 110 is provided in the periphery of the recess 31. The substrate holding member 110 can make contact with a side surface Ws of the wafer W, and holds the wafer W by making contact with the side surface Ws of the wafer W. The substrate holding member 110 is fixed to the rotating shaft 120, and is configured to freely rotate around the rotating shaft 120 as the center of rotation. The substrate holding member 110 rotates around the rotating shaft 120, thereby making contact with the side surface Ws of the wafer W which is placed in the recess 31 of the stage 3, to hold the wafer W.

The substrate holding member 110 may be formed of various materials, but because the substrate holding member 110 is exposed to a processing space inside the vacuum chamber 11, the substrate holding member 110 is preferably formed of a material having a high heat resistance with low dust generation. For example, the substrate holding member 110 is preferably made of the material having the high heat resistance with low dust generation, such as quartz, ceramics, or the like.

The substrate holding member 110 has an approximate L-shape in the cross sectional view, for example, and includes a vertical portion 111, a horizontal portion 112, and a curved portion 113.

The vertical portion 111 extends generally in a vertical direction. The vertical portion 111 includes a contact surface 111a which makes contact with the side surface Ws of the wafer W. As the substrate holding member 110 rotates around the rotating shaft 120, the contact surface 111a makes contact with the side surface Ws of the wafer W, to hold the wafer W. The vertical portion 111 is configured to be tiltable inward (toward a center direction of the stage 3) and outward (toward an outer peripheral direction of the stage 3) with respect to the vertical direction, for example. In FIG. 6, a state where the vertical portion 111 is tilted toward the inside is indicated by a solid line, a state where the vertical portion 111 is not tilted is indicated by a broken line, and a state where the vertical portion 111 is tilted toward the outside is indicated by a dotted line.

The horizontal portion 112 extends generally in the horizontal direction. The horizontal portion 112 includes a spring fixing portion 112a, and a protruding portion 112b. The spring fixing portion 112a is provided on a tip end of the horizontal portion 112, that is, at a position closer to the center of the stage 3 than the rotating shaft 120. In other words, the spring fixing portion 112a is provided between the rotating shaft 120 and the spring support 140 along the horizontal direction. One end 131 of the spring 130 is fixed to the spring fixing portion 112a. The protruding portion 112b protrudes upward from an upper surface of the tip end of the horizontal portion 112. The protruding portion 112b can protrude above the upper surface of recess 31, and is configured to be able to hold wafer W. The upper end of protruding portion 112b is rounded, for example. Hence, it is possible to minimize damage to a back surface of the wafer W when the protruding portion 112b makes contact with the back surface of the wafer W and lifts the wafer W. The protruding portion 112b may be omitted. In a case where the protruding portion 112b is not provided, a wafer support pin which can protrude above the upper surface of the recess 31, and hold, in a protruded state thereof, the back surface of the wafer W from underneath, is preferably provided in place of the protruding portion 112b.

The curved portion 113 is curved between the vertical portion 111 and the horizontal portion 112. The rotating shaft 120 is attached to the curved portion 113.

The rotating shaft 120 is a center axis which rotatably supports the substrate holding member 110, and is provided along a tangential direction of the stage 3. Hence, the substrate holding member 110 tilts inward and outward relative to the vertical direction, by rotating around the rotating shaft 120. The substrate holding member 110 makes contact with the side surface Ws of the wafer W to hold the wafer W, when tilted inward. The substrate holding member 110 separates from the side surface Ws of the wafer W and releases the wafer W from a held state, when tilted outward.

One end 131 of the spring 130 is fixed to the spring fixing portion 112a, and the other end 132 of the spring 130 is fixed to the spring support 140. The spring 130 is a biasing member for applying a biasing force to the substrate holding member 110. The spring 130 contracts to create the biasing force which pulls the horizontal portion 112 of the substrate holding member 110 downward. The downward pull of the horizontal portion 112 causes the substrate holding member 110 to rotate clockwise, so that the vertical portion 111 of the substrate holding member 110 tilts inward from the outside. Accordingly, the substrate holding member 110 applies a force which presses the side surface Ws of the wafer W toward the center of the stage 3, and more particularly, presses the side surface Ws of the wafer W obliquely from the upper side on the outside toward the lower side at the center of the stage 3. As a result, the wafer W assumes an elastically held state due to the biasing force, and it is possible to hold the wafer W without damaging the surface of the wafer W.

The spring 130 may be formed of various materials, but because the spring 130 is exposed to the processing space inside the vacuum chamber 11, the spring 130 is preferably formed of a material having a high heat resistance with low dust generation. For example, the spring 130 is preferably made of the material having the high heat resistance with low dust generation, such as quartz, ceramics, or the like. The type of the spring 130 is not particularly limited, and may be a coil spring, as illustrated in FIG. 6, for example. In addition, the spring 130 may be a leaf spring.

The spring support 140 is provided at a position separated from the substrate holding member 110 toward the center of the stage 3 along the horizontal direction, and below the rotating shaft 120 along the vertical direction. The spring support 140 serves as a support rod for supporting the spring 130, and the other end 132 of the spring 130 is fixed to the spring support 140.

The pressing member 150 is capable of pressing the lower surface of the horizontal portion 112 upward at the position where the spring fixing portion 112a is provided. The pressing member 150 is configured to be able to move up and down in the vertical direction. The pressing member 150 moves upward to press the horizontal portion 112 upward against the biasing force of the spring 130. When the horizontal portion 112 is pressed upward, the substrate holding member 110 rotates counterclockwise, so that the vertical portion 111 tilts from the state tilted toward the inside as indicated by the solid line in FIG. 6, to the state where the vertical portion 111 is not tilted as indicated by the broken line in FIG. 6. In the state indicated by the broken line in FIG. 6, the vertical portion 111 is tilted more toward the outside than the state indicated by the solid line in FIG. 6. In the state indicated by the broken line in FIG. 6, the vertical portion 111 spreads outward in the plan view when compared to the state indicated by the solid line. Hence, the contact surface 111a of the vertical portion 111 separates from the side surface Ws of the wafer W, to release the holding of the wafer W by the substrate holding member 110. In addition, when the horizontal portion 112 is pressed further upward, the substrate holding member 110 rotates further counterclockwise, so that the vertical portion 111 tilts further toward the outside, as indicated by the dotted line in FIG. 6. In this state, the protruding portion 112b of the horizontal portion 112 makes contact with the back surface of the wafer W, thereby raising the wafer W. In the state indicated by the dotted line in FIG. 6, the vertical portion 111 spreads outward in the plan view when compared to the state indicated by the broken line. On the other hand, when the pressing member 150 moves downward, the pressing member 150 separates from the lower surface of the horizontal portion 112, and the center of the spring fixing portion 112a is positioned on an imaginary line segment connecting the center of the rotating shaft 120 and the center of the spring support 140, due to the biasing force of the spring 130. In FIG. 6, this imaginary line segment is indicated by a one-dot chain line.

[Operation of Substrate Holding Mechanism]

An example of the operation of the substrate holding mechanism 100 will be described, by referring to FIG. 7 through FIG. 10. FIG. 7 through FIG. 10 are diagrams illustrating the example of the operation of the substrate holding mechanism 100.

Figure 7:
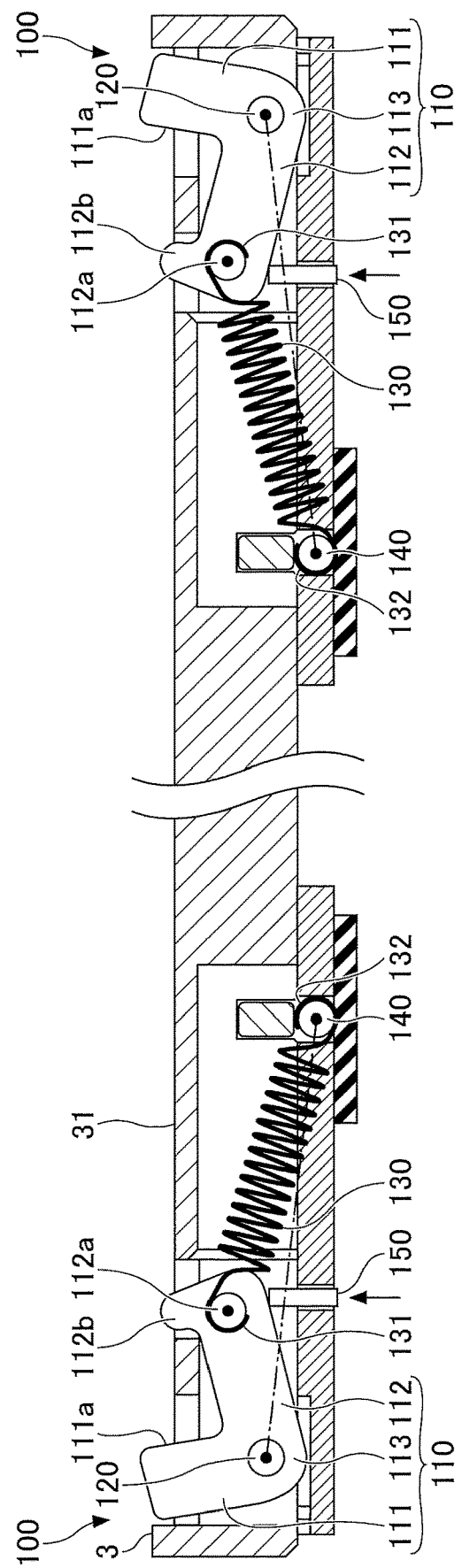
FIG. 7 is a diagram (part 1) illustrating an example of an operation of the substrate holding mechanism.

First, as illustrated in FIG. 7, the controller 90 moves the pressing member 150 upward, to press the horizontal portion 112 upward against the biasing force of the spring 130, and rotate the substrate holding member 110. Hence, the vertical portion 111 tilts toward the outside, and the protruding portion 112b formed on the horizontal portion 112 protrudes above the upper surface of the recess 31. In this state, because the spring fixing portion 112a moves upward due to the rotation of the substrate holding member 110, the center of the spring fixing portion 112a moves above from the imaginary line segment connecting the center of the rotating shaft 120 and the center of the spring support 140. FIG. 7 illustrates a state before the wafer W is transported to the stage 3, and the imaginary line segment is indicated by the one-dot chain line.

Figure 8:
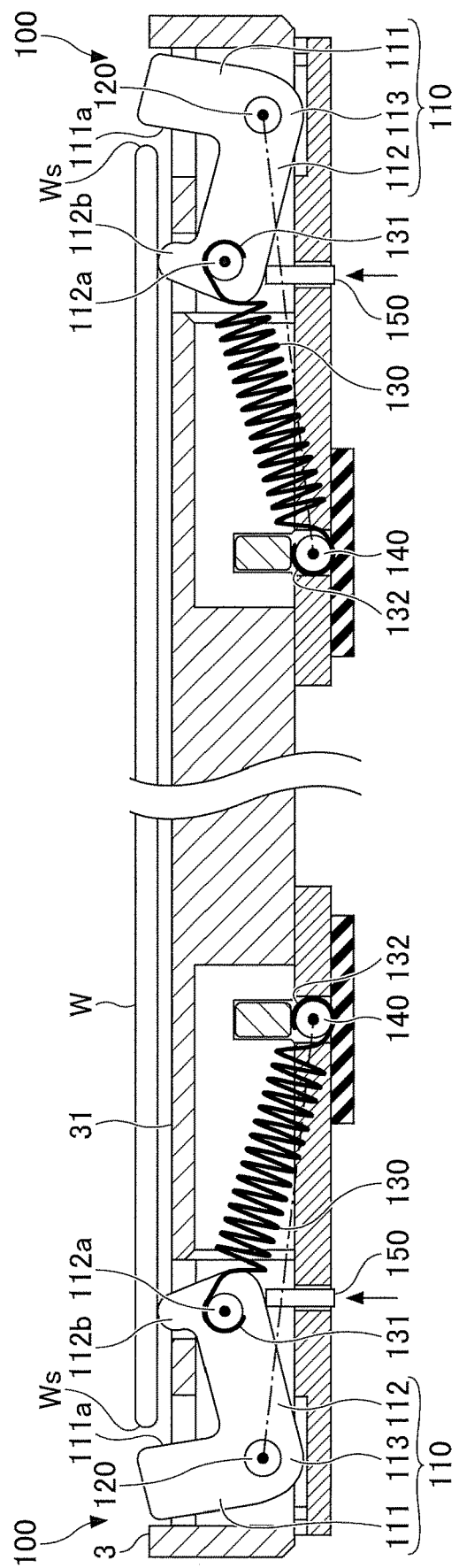
FIG. 8 is a diagram (part 2) illustrating the example of the operation of the substrate holding mechanism.

Next, as illustrated in FIG. 8, the controller 90 controls a transport mechanism (not illustrated) to place the wafer W, held by the transport mechanism, onto the protruding portions 112b. FIG. 8 illustrates a state where the wafer W is held by the protruding portions 112b.

Figure 9:
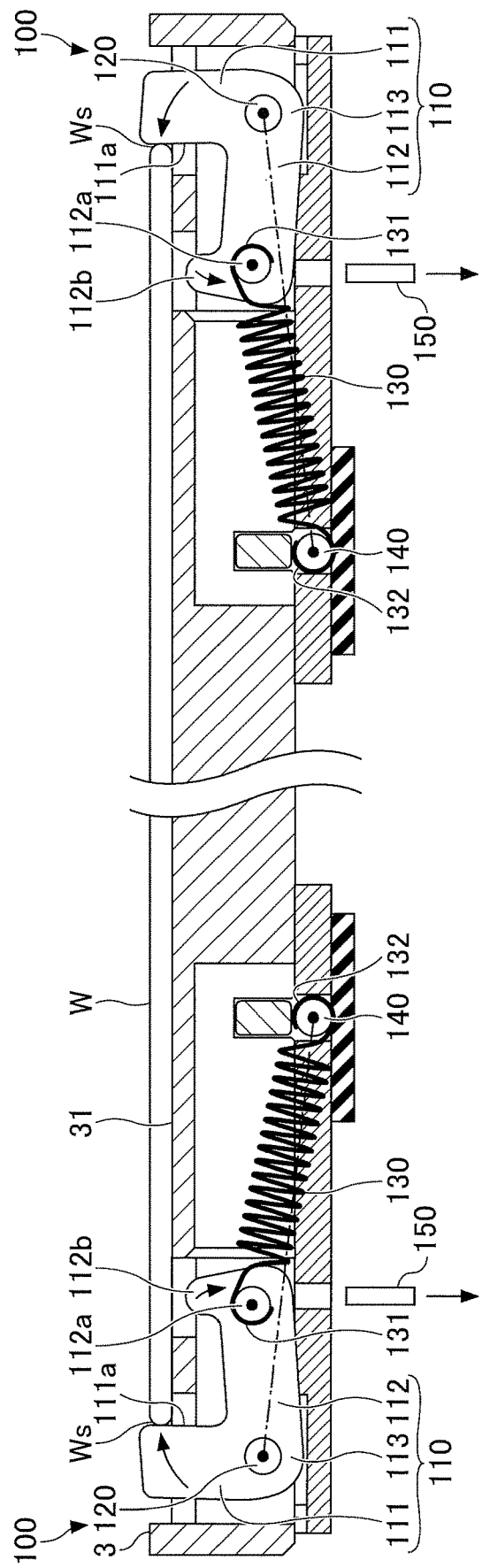
FIG. 9 is a diagram (part 3) illustrating the example of the operation of the substrate holding mechanism.

Next, as illustrated in FIG. 9, the controller 90 moves the pressing member 150 downward, to separate the pressing member 150 from the lower surface of the horizontal portion 112. Hence, the substrate holding member 110 rotates due to the biasing force of the spring 130. Due to the rotation of the substrate holding member 110, the protruding portion 112b formed on the horizontal portion 112 moves below the upper surface of the recess 31, and the wafer W is placed in the recess 31. Further, due to the rotation of the substrate holding member 110, the vertical portion 111 tilts from the outside toward the inside. As a result, the substrate holding member 110 applies a force on the wafer W, causing the contact surface 111a to make contact with the side surface Ws of the wafer W, and pressing the side surface Ws of the wafer W obliquely from the outside upper portion toward the lower center portion. Hence, the wafer W is elastically held by the biasing force. FIG. 9 illustrates a state where the wafer W is placed in the recess 31 and held by the substrate holding member 110.

When the turntable 2 rotates, the center of the wafer W placed in the recess 31 may become displaced or misaligned from the center of the recess 31 due to a centrifugal force generated by the rotation of the turntable 2. This is because the inner diameter of the recess 31 is slightly larger than the diameter of the wafer W. In addition, when the stage 3 rotates with respect to the turntable 2 while the turntable 2 is rotating, the wafer W may rotate with respect to the stage 3. Particularly in a case where the turntable 2 rotates at a high speed (at the rotational speed of 50 rpm to 300 rpm, for example), the center axis deviation of the wafer W with respect to the stage 3 tends to become large.

For this reason, according to the substrate holding mechanism 100 of the present disclosure, the vertical portion 111 of the substrate holding member 110 is configured to be able to tilt toward the inside and the outside with respect to the vertical direction. Hence, even if the center axis of the wafer W deviates from the center of the recess 31, the substrate holding member 110 can continue to hold the side surface Ws of the wafer W according to the deviation of the wafer W. As a result, it is possible to reduce the rotation of the wafer W with respect to the stage 3.

Figure 10:
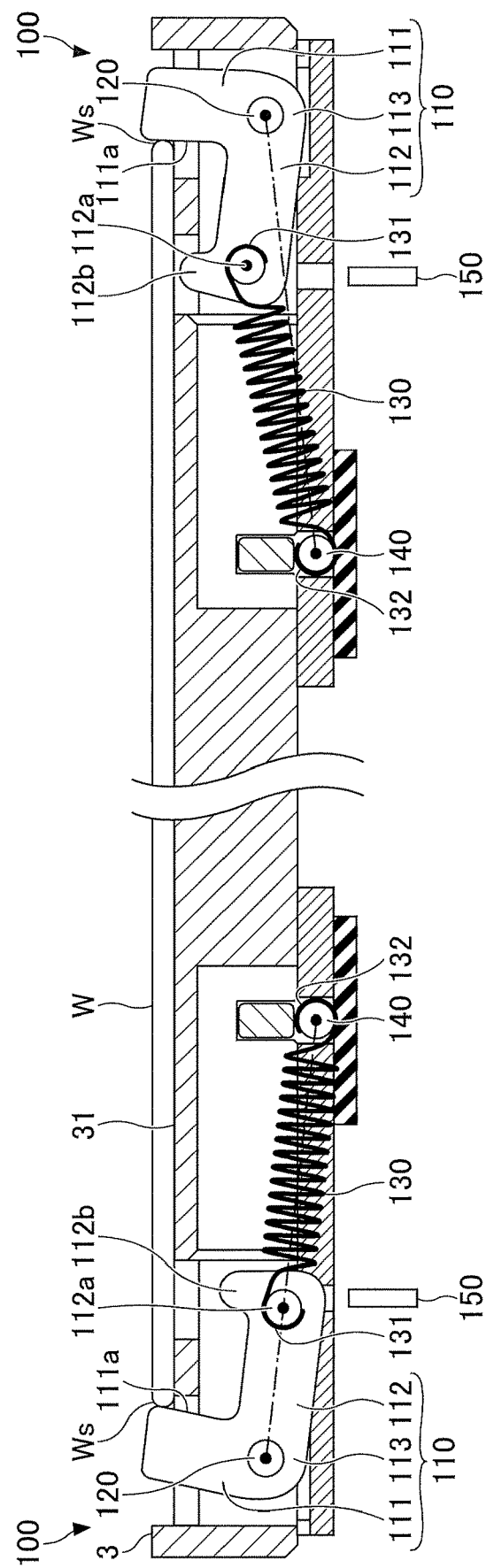
FIG. 10 is a diagram (part 4) illustrating the example of the operation of the substrate holding mechanism.

More particularly, when the centrifugal force from the left direction toward the right direction is applied with respect to the wafer W due to the rotation of the turntable 2, the right side surface Ws of the wafer W presses against the contact surface 111a of the right substrate holding member 110, as illustrated in FIG. 10. In this state, if the vertical portion 111 of the substrate holding member 110 were not tiltable toward the inside with respect to the vertical direction, the contact surface 111a of the left substrate holding member 110 would separate from the side surface Ws of the wafer W, and the holding of the wafer W by the substrate holding member 110 would be released. Further, the wafer W may rotate with respect to the stage 3 around a position where the wafer W makes contact with the right substrate holding member 110. On the contrary, according to the substrate holding mechanism 100 of the present disclosure, as illustrated in FIG. 10, the horizontal portion 112 of the substrate holding member 110 is pulled downward by the biasing force of the spring 130 of the left substrate holding mechanism 100, so that the vertical portion 111 tilts toward the inside with respect to the vertical direction. For this reason, the contact surface 111a of the left substrate holding member 110 maintains the state in contact with the side surface Ws of the wafer W. In other words, the wafer W is maintained in the state held by the three substrate holding mechanisms 100. As a result, it is possible to reduce the rotation of the wafer W with respect to the stage 3.

Moreover, according to the substrate holding mechanism 100 of the present disclosure, because the vertical portion 111 of the substrate holding member 110 is configured to be able to tilt toward the inside and the outside with respect to the vertical direction, the three substrate holding members 110 maintain the state in contact with the side surface Ws of the wafer W even if the wafer W undergoes a thermal expansion. In other words, the wafer W is maintained in the state held by the three substrate holding mechanisms 100. As a result, it is possible to reduce the rotation of the wafer W with respect to the stage 3.

Accordingly, according to the substrate holding mechanism 100 of the present disclosure, even if the center axis of the wafer W deviates from the center of the stage 3 due to the centrifugal force, or the wafer W undergoes the thermal expansion, it is possible to continue to hold the wafer W. As a result, it is possible to reduce the rotation of the wafer W with respect to the stage 3.

Exemplary Implementations

Figure 11:
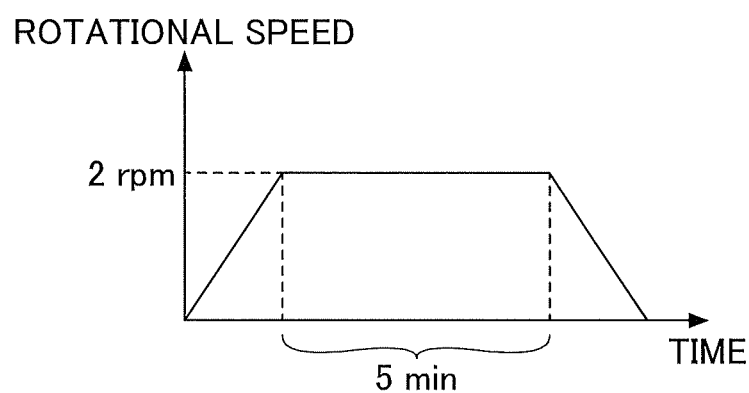
FIG. 11 is a diagram for explaining conditions of exemplary implementations.
Figure 12:
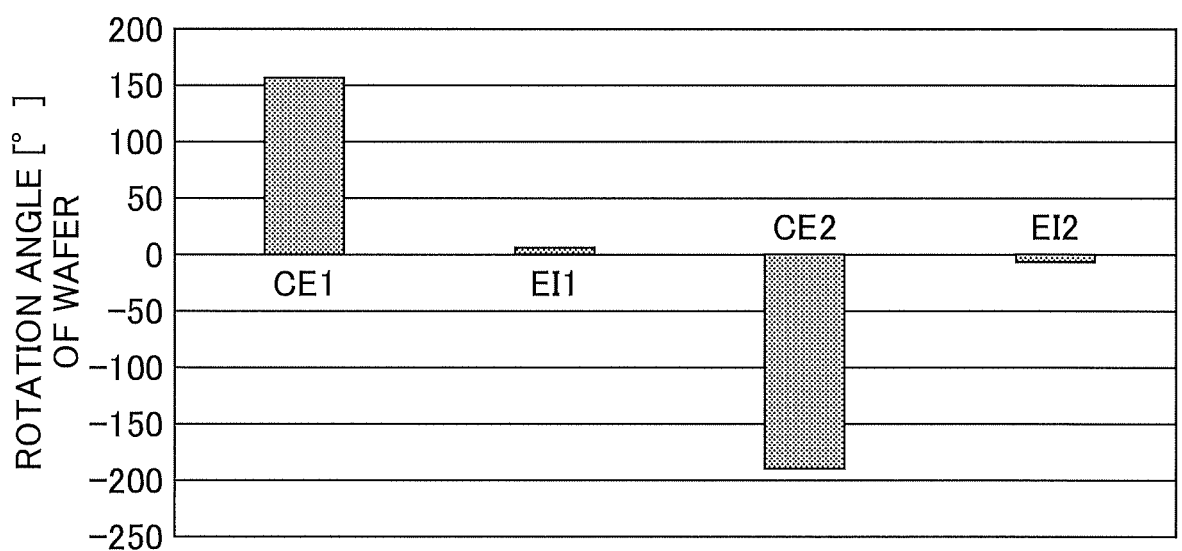
FIG. 12 is a diagram for explaining results of the exemplary implementations.

Exemplary implementations for which the effects of the substrate holding mechanism 100 were confirmed. will be described with reference to FIG. 11 and FIG. 12. FIG. 11 is a diagram for explaining conditions of the exemplary implementations. FIG. 12 is a diagram for explaining results of the exemplary implementations.

First Exemplary Implementation EI1

In a first exemplary implementation EI1, the wafer W is placed on the upper surface of the stage 3, and the turntable 2 is rotated at a rotational speed of 240 rpm in a state where the wafer W is held by the substrate holding mechanism 100 described above. At the same time, the stage 3 is rotated at a predetermined rotational speed in the same direction as the rotating direction of the turntable 2. In other words, in the first exemplary implementation EI1, the wafer W revolves at the rotational speed of 240 rpm while rotating at the predetermined rotational speed in the same direction as the revolving direction. As illustrated in FIG. 11, under predetermined conditions, a cycle in which the rotational speed of the stage 3 is gradually increased from a state where the stage 3 is stationary to a state where the rotational speed is 2 rpm, and the stage 3 is rotated at the rotational speed to 2 rpm for 5 minutes, and the rotational speed of the stage 3 is thereafter gradually decreased until the stage 3 stops rotating, is repeated ten times. In addition, the angle (rotation angle) by which the wafer W rotates with respect to the stage 3 is measured.

Second Exemplary Implementation EI2

In a second exemplary implementation EI2, the wafer W is placed on the upper surface of the stage 3, and the turntable 2 is rotated at a rotational speed of 240 rpm in a state where the wafer W is held by the substrate holding mechanism 100 described above. At the same time, the stage 3 is rotated at a predetermined rotational speed in a direction opposite to the rotating direction of the turntable 2. In other words, in the second exemplary implementation EI2, the wafer W revolves at the rotational speed of 240 rpm while rotating in the direction opposite to the revolving direction. As illustrated in FIG. 11, under predetermined conditions, a cycle in which the rotational speed of the stage 3 is gradually increased from a state where the stage 3 is stationary to a state where the rotational speed is 2 rpm, and the stage 3 is rotated at the rotational speed to 2 rpm for 5 minutes, and the rotational speed of the stage 3 is thereafter gradually decreased until the stage 3 stops rotating, is repeated ten times. In addition, the angle (rotation angle) by which the wafer W rotates with respect to the stage 3 is measured.

First Comparative Example CE1

In a first comparative example CE1, the wafer W is placed on the upper surface of the stage 3, and the turntable 2 and the stage 3 are rotated under the same conditions as in the first exemplary implementation EI1, but without holding the wafer W by the substrate holding mechanism 100. In addition, the angle (rotation angle) by which the wafer W rotates with respect to the stage 3 is measured.

Second Comparative Example CE2

In a second comparative example CE2, the wafer W is placed on the upper surface of the stage 3, and the turntable 2 and the stage 3 are rotated under the same conditions as in the second exemplary implementation EI2, but without holding the wafer W by the substrate holding mechanism 100. In addition, the angle (rotation angle) by which the wafer W rotates with respect to the stage 3 is measured.

[Evaluation Results]

As illustrated in FIG. 12, in first exemplary implementation EI1, the rotation angle of the wafer W is 6 degrees, while in the first comparative example CE1, the rotation angle of the wafer W is 156 degrees. From these results, it may be regarded that by holding the wafer W on the upper surface of the stage 3 by the substrate holding mechanism 100, the rotation angle of the wafer W itself can be reduced to 4% or less, when compared to the case where the wafer W placed on the upper surface of the stage 3 is not held by the substrate holding mechanism 100.

In the second exemplary implementation EI2, the rotation angle of the wafer W is 6 degrees, while in the second comparative example CE2, the rotation angle of the wafer W is 189 degrees. In other words, by holding the wafer W placed on the upper surface of the stage 3 by the substrate holding mechanism 100, the rotation angle of the wafer W itself can be reduced to 4% or less, when compared to the case where the wafer W placed on the upper surface of the stage 3 is not held by the substrate holding mechanism 100.

Further, from the results obtained for the first and second exemplary implementations EI1 and EI2 and the first and second comparative examples CE1 and CE2, it may be regarded that the rotation angle of the wafer W itself can be greatly reduced regardless of the rotating direction of the stage 3 with respect to the rotating direction of the turntable 2, when the wafer W placed on the upper surface of the stage 3 is held by the substrate holding mechanism 100.

The embodiments and exemplary implementations disclosed herein should be considered to be exemplary in all respects and not limiting. In the embodiments and exemplary implementations, various omissions, substitutions, and modifications of various forms may be made without departing from the scope and spirit of the present disclosure.

Therefore, according to the present disclosure, it is possible to reduce the rotation of the substrate with respect to the stage when the substrate placed on the stage is caused to revolve.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate holding mechanism for holding a substrate placed on a stage which is rotatable with respect to a turntable, the substrate holding mechanism comprising:
   a substrate holding member, provided at a peripheral portion of the stage, and having a vertical portion that includes a contact surface contactable to a side surface of the substrate placed on the stage, a horizontal portion, and a curved portion fixed to a rotating shaft disposed below a surface on which the substrate is placed, the curved portion connecting the vertical portion and the horizontal portion;
   a biasing member having a first end fixed to a tip end of the horizontal portion at a position closer to a center of the stage than the rotating shaft, and a second end fixed to a support of the stage at a position separated from the substrate holding member toward the center of the stage and below the rotating shaft, so as to extend obliquely to a direction perpendicular to the surface on which the substrate is placed; and
   a pressing member configured to press the tip end of the horizontal portion upwardly.

2. The substrate holding mechanism as claimed in claim 1, wherein the rotating shaft is positioned outside the side surface of the substrate in a state where the substrate is placed at the center of the stage.

3. The substrate holding mechanism as claimed in claim 2, wherein
the substrate holding member has an approximate L-shape including the vertical portion extending in an approximately vertical direction, and the horizontal portion extending in an approximately horizontal direction via the curved portion.

4. The substrate holding mechanism as claimed in claim 3, wherein the vertical portion tilts toward the center of the stage with respect to the vertical direction, in a state where the first end of the biasing member is on an imaginary straight line connecting the rotating shaft and the second end of the biasing member.

5. The substrate holding mechanism as claimed in claim 4, wherein the pressing member is configured to press the horizontal portion from below the horizontal portion.

6. The substrate holding mechanism as claimed in claim 1, wherein
the substrate holding member has an approximate L-shape including the vertical portion extending in an approximately vertical direction, and the horizontal portion extending in an approximately horizontal direction via the curved portion.

7. The substrate holding mechanism as claimed in claim 6, wherein the vertical portion tilts toward the center of the stage with respect to the vertical direction, in a state where the first end of the biasing member is on an imaginary straight line connecting the rotating shaft and the second end of the biasing member.

8. The substrate holding mechanism as claimed in claim 6, wherein the pressing member is configured to press the horizontal portion from below the horizontal portion.

9. The substrate holding mechanism as claimed in claim 6, wherein the biasing member is a spring.

10. The substrate holding mechanism as claimed in claim 2, wherein the biasing member is a spring.

11. The substrate holding mechanism as claimed in claim 1, wherein the biasing member is a spring.

12. The substrate holding mechanism as claimed in claim 1, wherein the substrate holding member, the biasing member, and the pressing member are provided at the peripheral portion of the stage, at a plurality of positions.

13. The substrate holding mechanism as claimed in claim 1, wherein the substrate holding member, the biasing member, and the pressing member are provided at the peripheral portion of the stage, at three or more positions.

14. A substrate processing apparatus comprising:
a turntable provided inside a vacuum chamber;
a stage, rotatable with respect to the turntable, and having an upper surface on which a substrate is placed; and
a substrate holding mechanism configured to hold the substrate placed on the stage,
wherein the substrate holding mechanism includes
a substrate holding member, provided at a peripheral portion of the stage, and having a vertical portion that includes a contact surface contactable to a side surface of the substrate placed on the stage, a horizontal portion, and a curved portion fixed to a rotating shaft disposed below a surface on which the substrate is placed, the curved portion connecting the vertical portion and the horizontal portion,
a biasing member having a first end fixed to a tip end of the horizontal portion at a position closer to a center of the stage than the rotating shaft, and a second end fixed to a support of the stage at a position separated from the substrate holding member toward the center of the stage and below the rotating shaft, so as to extend obliquely to a direction perpendicular to the surface on which the substrate is placed, and
a pressing member configured to press the tip end of the horizontal portion upwardly.

15. The substrate processing apparatus as claimed in claim 14, wherein the rotating shaft of the substrate holding mechanism is positioned outside the side surface of the substrate in a state where the substrate is placed at the center of the stage.

16. The substrate processing apparatus as claimed in claim 14, wherein
the substrate holding member of the substrate holding mechanism has an approximate L-shape including the vertical portion extending in an approximately vertical direction, and the horizontal portion extending in an approximately horizontal direction via the curved portion.

17. The substrate processing apparatus as claimed in claim 16, wherein the vertical portion tilts toward the center of the stage with respect to the vertical direction, in a state where the first end of the biasing member is on an imaginary straight line connecting the rotating shaft and the second end of the biasing member.

18. The substrate processing apparatus as claimed in claim 16, wherein the pressing member of the substrate holding mechanism is configured to press the horizontal portion from below the horizontal portion.

19. The substrate processing apparatus as claimed in claim 14, wherein the biasing member of the substrate holding mechanism is a spring.

20. The substrate processing apparatus as claimed in claim 14, wherein the substrate holding member, the biasing member, and the pressing member of the substrate holding mechanism are provided at the peripheral portion of the stage, at a plurality of positions.

* * * * *